(12) United States Patent
Matsuo

(10) Patent No.: US 6,333,467 B1
(45) Date of Patent: Dec. 25, 2001

(54) FLEXIBLE PRINTED WIRING BOARD

(75) Inventor: Junichi Matsuo, Saitama (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/517,060

(22) Filed: Mar. 2, 2000

(30) Foreign Application Priority Data

Mar. 2, 1999 (JP) ................................................. 11-054457

(51) Int. Cl.[7] ............................... H05K 1/00; H01R 3/00
(52) U.S. Cl. ........................ 174/254; 174/250; 174/255; 361/741; 361/747; 439/488; 439/495
(58) Field of Search .................................... 174/254, 255, 174/258, 261, 268, 250, 72 A; 439/495, 488; 361/117 F, 117 FF, 777, 774, 770, 741, 747, 759, 785, 786, 789, 791

(56) References Cited

U.S. PATENT DOCUMENTS

| | | | |
|---|---|---|---|
| 3,057,952 | * 10/1962 | Gordon | 174/117 R |
| 3,168,617 | * 2/1965 | Richter | 174/117 FF |
| 4,679,868 | * 7/1987 | Hasircoglu | 439/495 |
| 5,476,393 | * 12/1995 | Narita | 439/495 |
| 5,598,627 | * 2/1997 | Saka et al. | 29/861 |
| 5,779,498 | * 7/1998 | Asakawa | 439/495 |
| 5,911,597 | * 6/1999 | Oshitani | 439/495 |
| 5,928,029 | * 7/1999 | Lam | 439/497 |
| 5,936,850 | * 8/1999 | Takahashi et al. | 361/784 |
| 5,944,553 | * 8/1999 | Yasui et al. | 439/495 |
| 5,967,785 | * 10/1999 | Maeda et al. | 434/77 |
| 5,999,097 | * 12/1999 | Liddle et al. | 340/550 |
| 6,004,156 | * 12/1999 | Roque et al. | 439/495 |
| 6,020,559 | * 2/2000 | Maeda | 174/117 F |
| 6,062,900 | * 5/2000 | Juntwait | 439/495 |
| 6,089,905 | * 7/2000 | Shimmyo et al. | 439/495 |
| 6,093,894 | * 7/2000 | Carlson et al. | 174/117 F |
| 6,201,193 | * 3/2001 | Hashimoto | 174/260 |

FOREIGN PATENT DOCUMENTS

| | | |
|---|---|---|
| 7170040 | 7/1995 | (JP) . |
| 91239323 | 5/1997 | (JP) . |

* cited by examiner

*Primary Examiner*—Jeffrey Gaffin
*Assistant Examiner*—I B Patel

(57) ABSTRACT

A flexible printed wiring board connectable with a connect or includes a cover coating and a base film. A patterned line array of plural lines are covered between the cover coating and the base film. The plural lines are arranged crosswise to a line longitudinal direction thereof. A terminal section is defined by extending the first insulator layer and the patterned line array from the second insulator layer in the line longitudinal direction, for partially uncovering the patterned line array for external connection. A white line-shaped indicia is disposed on a reinforcer plate at the base film and close to the terminal section, and adapted to positioning the terminal section in the connector.

10 Claims, 5 Drawing Sheets

FLEXIBLE PRINTED WIRING BOARD

BACKGROUND OF THE INVENTION

1. Field of the Invention

The present invention relates to a flexible printed wiring board. More particularly, the present invention relates to a flexible printed wiring board which can be connected to a connector in a reliably set manner of terminals without deviations or errors.

2. Description Related to the Prior Art

It has been recently suggested to reduce sizes and thicknesses of electronic instruments. Density of circuits used for them are increased by use of integrated circuits (IC), large-scale integration (LSI), parts of chips and the like. Printed circuit boards are used with flexible printed wiring board which connects them with one another. It has been also suggested to increase density of patterned lines included in the flexible printed wiring board.

The flexible printed wiring board includes a terminal section in which ends of the patterned lines are uncovered externally. A connector has an insertion slot, in which the terminal section is inserted and retained by a retaining mechanism of the connector fixedly, so as to connect the patterned lines with respectively contact points of the connector. If the patterned lines are disposed in a high density in the flexible printed wiring board, there arises a problem in that an uncovered area of the patterned lines is small at the terminal section. Thus failure in the contact is likely to occur. It is known that terminals of the terminal section are provided with a great width typically in the flexible printed wiring board with great density, because portions of the patterned lines at the terminal section are disposed in a zigzag manner.

However, the arrangement of the terminals of the terminal section at a small pitch in a zigzag is likely to result in failure in the connection, particularly when the terminal section is inserted only a small amount, or with an inclination to the insertion direction.

JP-A 07-170040 discloses a construction with signs provided in the patterned lines in the flexible printed wiring board for the purpose of acceptable insertion of the terminal section into the connector. The use of signs in the patterned lines are certainly effective in checking an amount of the insertion of the terminal section. However a problem lies in that it is difficult to check straightness of the terminal section relative to the connector.

JP-A 09-129323 discloses a construction with positioning projections and positioning holes in each of the connector and the flexible printed wiring board for the purpose of acceptable insertion of the terminal section into the connector. However there is a problem in that the connector and the flexible printed wiring board must have a great size due to the projections and holes. At the time of connection or disconnection of the flexible printed wiring board, portions having the projections and holes must be eliminated. So efficiency in the connecting or disconnecting operation is low.

SUMMARY OF THE INVENTION

In view of the foregoing problems, an object of the present invention is to provide a flexible printed wiring board of which a terminal section can be inserted in a connector at a proper amount of insertion and in a proper direction of the insertion.

In order to achieve the above and other objects and advantages of this invention, a flexible printed wiring board connectable with a connector includes at least first and second flexible insulator layers. A patterned line array of plural lines are covered between the first and second insulator layers, the plural lines being arranged crosswise to a line longitudinal direction thereof. A terminal section is defined by extending the first insulator layer and the patterned line array from the second insulator layer in the line longitudinal direction, for partially uncovering the patterned line array for external connection. At least one indicia is disposed on at least one of the first and second insulator layers and close to the terminal section, and adapted to positioning the terminal section in the connector.

In a preferred embodiment, the at least one indicia is disposed on the first insulator layer.

The at least one indicia is directed crosswise to the line longitudinal direction.

The first insulator layer comprises a base film for supporting the patterned line array. Furthermore, a reinforcer plate is secured to a surface of the base film opposite to the patterned line array, for reinforcing the terminal section. The at least one indicia is disposed on the reinforcer plate.

The connector includes a connector inner wall, which has a wall edge, and on which the terminal section is set crosswise to the wall edge. Plural contact points are disposed on the connector inner wall in an array along the wall edge, for contacting the terminal section. When the terminal section is set on the connecter inner wall, the at least one indicia is directed substantially parallel to the wall edge.

The at least one indicia has a predetermined color distinct from a color of the first or second insulator layer.

The predetermined color is a light color.

In a preferred embodiment, the at least one indicia is line-shaped.

The at least one indicia is two indicia arranged in the line longitudinal direction, a space between the two indicia being adapted to positioning the terminal section in the connector.

In another preferred embodiment, the at least one indicia is plural indicia arranged crosswise to the line longitudinal direction.

In still another preferred embodiment, the at least one indicia is a colored portion having a size associated with the terminal section in the reinforcer plate.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENT(S) OF THE PRESENT INVENTION

Figure 1:
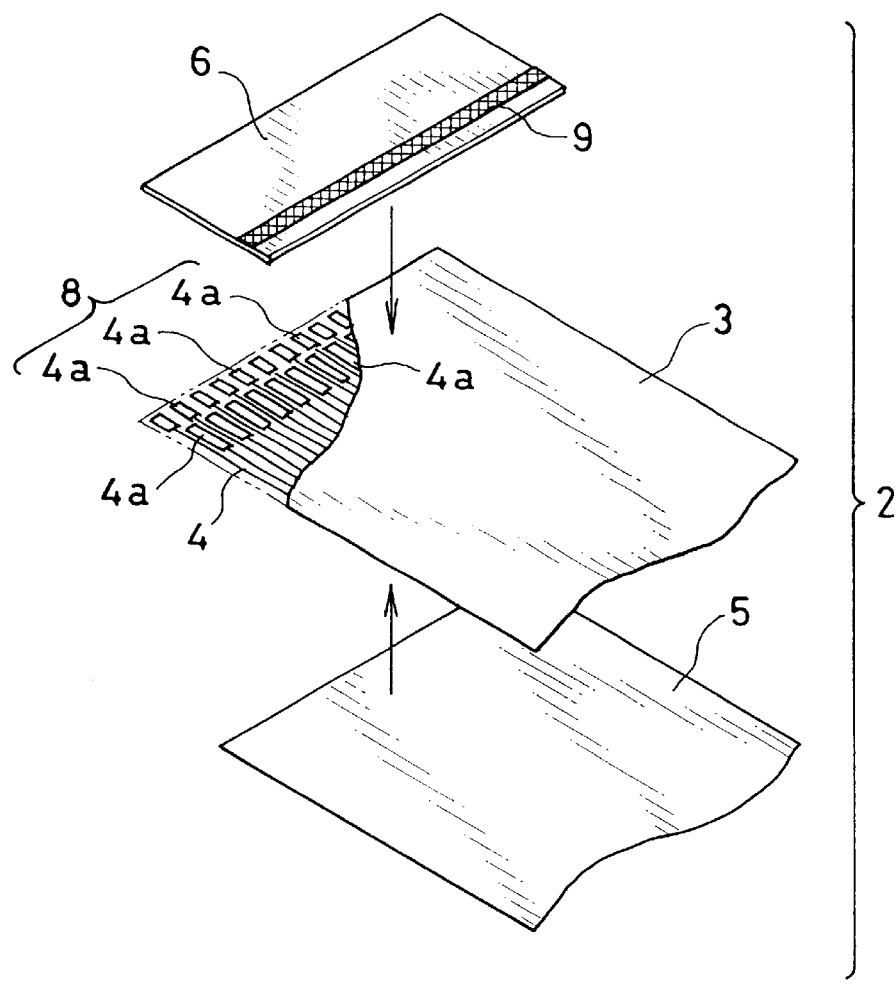
FIG. 1 is an exploded perspective illustrating a flexible printed wiring board.
Figure 2:
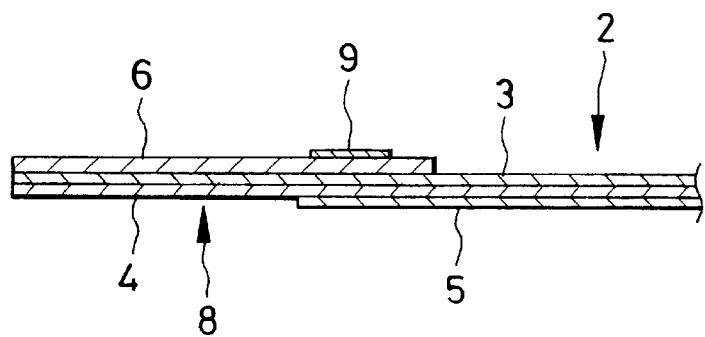
FIG. 2 is a vertical section, partially broken, illustrating the same as FIG. 1.

In FIGS. 1 and 2, a flexible printed wiring board 2 consists of a base film 3, a patterned line array 4, a cover coating or cover lay 5 and a reinforcer plate 6. The base film 3 is a film of resin such as polyester or polyimide, and has flexibility and an insulating characteristic. The patterned line array 4 includes plural patterned lines arranged on one surface of the base film 3 at a small pitch. The cover coating 5 is disposed on the base film 3 by coating operation, and covers the patterned line array 4. Or else, the cover coating 5 may be a film attached to the base film 3. The reinforcer plate 6 is connected with an end of the base film 3. The base film 3 constitutes a first insulator layer of the flexible printed wiring board 2, of which the cover coating 5 constitutes a second insulator layer.

Terminals 4a are disposed on respectively ends of the patterned line array 4, and have a greater width. In order to avoid interference between adjacent ones of the terminals 4a, the terminals 4a are disposed in a zigzag manner with reference to the width direction of the flexible printed wiring board 2. As the cover coating 5 is shortened In comparison with the base film 3, a terminal section 8 is constructed by external arrangement of the terminals 4a of the patterned line array 4.

A white line-shaped indicia 9 is printed on the reinforcer plate 6 by silk printing, and extends in the width direction of the flexible printed wiring board 2. In the course of manufacturing the flexible printed wiring board 2, the white line-shaped indicia 9 is printed in the process of manufacturing the reinforcer plate 6. Thus efficiency of manufacturing the flexible printed wiring board 2 can be kept high without a drop. Note that the terminal section 8 is disposed on each of the two distal ends of the flexible printed wiring board 2. Only one of the two distal ends is depicted in the drawings.

Figure 3:
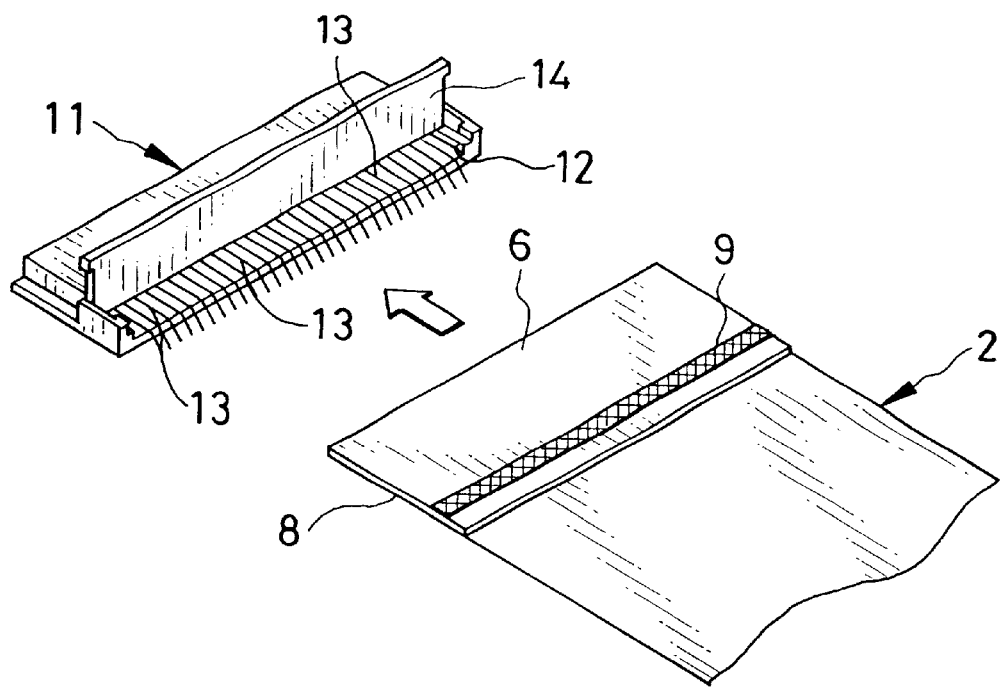
FIG. 3 is a perspective illustrating the flexible printed wiring board and a connector for use therewith.

In FIG. 3, a connector 11 for use with the flexible printed wiring board 2 is depicted. An insertion slot 12 is formed in the connector 11, and receives insertion of the terminal section 8 of the flexible printed wiring board 2. A connector body of the connector 11 is formed from a plastic material having an insulating characteristic. Plural contact points 13 of metal are disposed inside a connector inner wall of the insertion slot 12 for contact with the terminals 4a of the flexible printed wiring board 2. A lock plate 14 is disposed on the connector body in a rotatable manner, and when swung up, opens the insertion slot 12 wide, and when swung down, sandwiches the terminal section 8 of the flexible printed wiring board 2 for tight retention.

Figure 4:
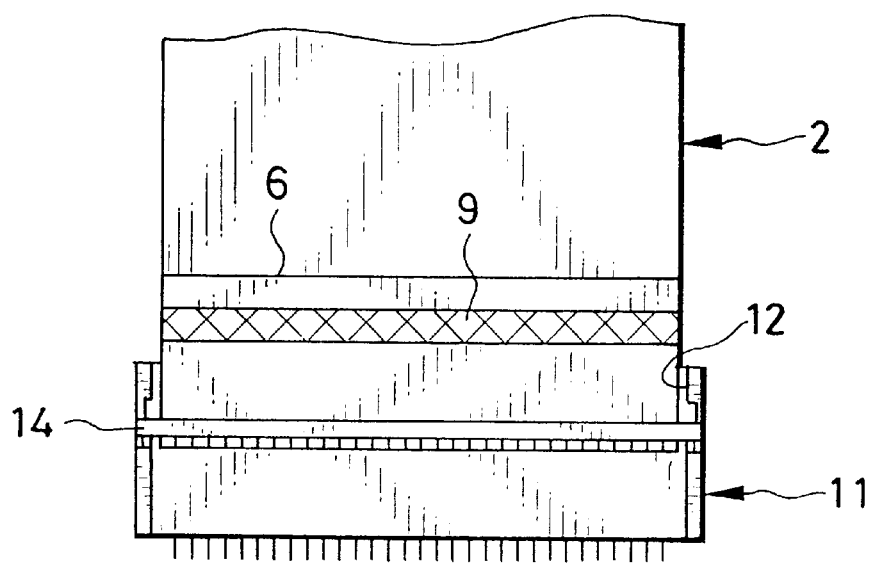
FIG. 4 is a plan illustrating the same as FIG. 3 but in which a terminal section is placed on the connector.
Figure 5:
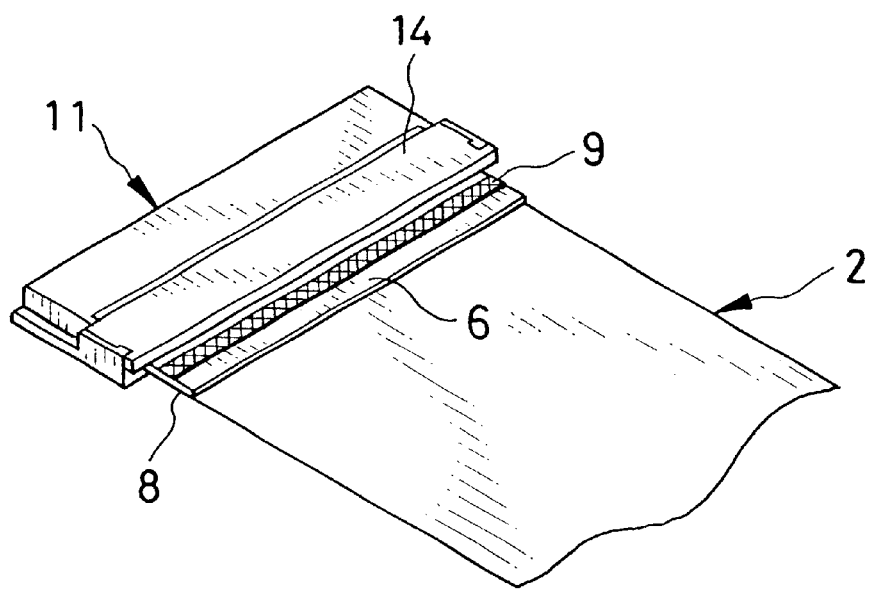
FIG. 5 is a perspective illustrating the same as FIG. 3 but in which a lock plate is folded and closed.

FIG. 4 depicts an inserted state of the terminal section 8 of the flexible printed wiring board 2 in the insertion slot 12 of the connector 11. A user checks the position and direction of the white line-shaped indicia 9 with reference to an edge of the insertion slot 12 of the connector 11. So the propriety in the insertion of the terminal section 8 into the connector 11 can be confirmed. In FIG. 5, the lock plate 14 is folded to retain the flexible printed wiring board 2 fixedly after the proper insertion of the terminal section 8 in the connector 11.

Figure 6:
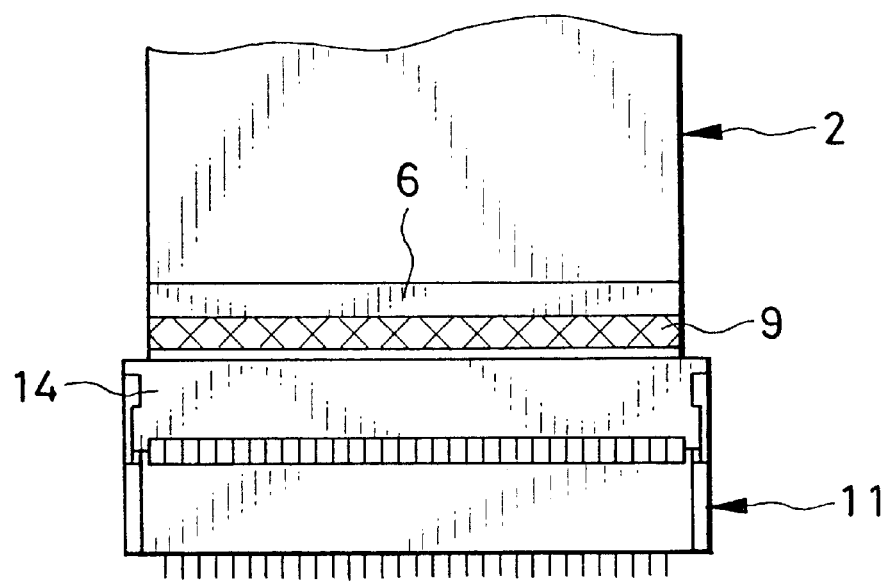
FIG. 6 is a plan illustrating the same as FIG. 5.

Then the user checks the position and direction of the white line-shaped indicia 9 with reference to an edge of the lock plate 14. See FIG. 6. Finally the terminal section 8 of the flexible printed wiring board 2 can be connected with the insertion slot 12 in the connector 11 after the appropriate positioning.

Figure 7:
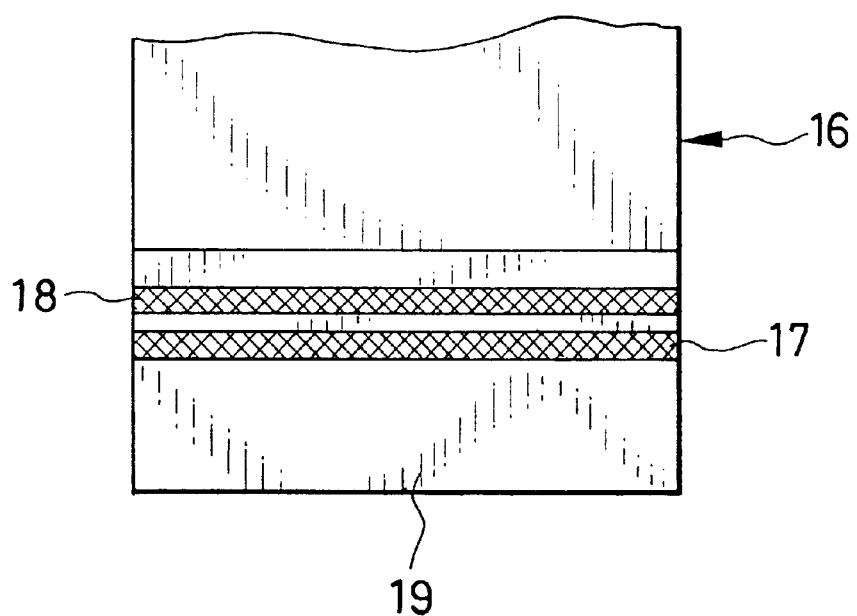
FIG. 7 is a plan illustrating another preferred flexible printed wiring board having two line-shaped indicia.

In spite of the white line-shaped indicia 9 of the above embodiment, a preferred flexible printed wiring board 16 may have first and second white line-shaped indicia 17 and 18. See FIG. 7. The first white line-shaped indicia 17 is used for checking an amount of insertion. The second white line-shaped indicia 18 is used for checking a direction of the insertion. When the flexible printed wiring board 16 is properly inserted in the connector 11, the lock plate 14 in the closed position covers the first white line-shaped indicia 17. This is effective in confirming the proper mount of the insertion of a terminal section 19. After the lock plate 14 is closed, positions of the second white line-shaped indicia 18 and the edge of the lock plate 14 can be ensured to confirm the inserting direction of the terminal section 19.

Figure 8:
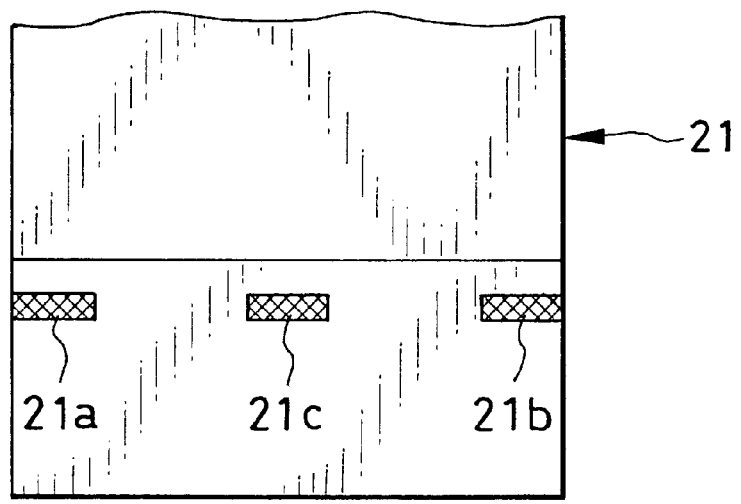
FIG. 8 is a plan illustrating a further preferred flexible printed wiring board having a line of plural indicia.
Figure 9:
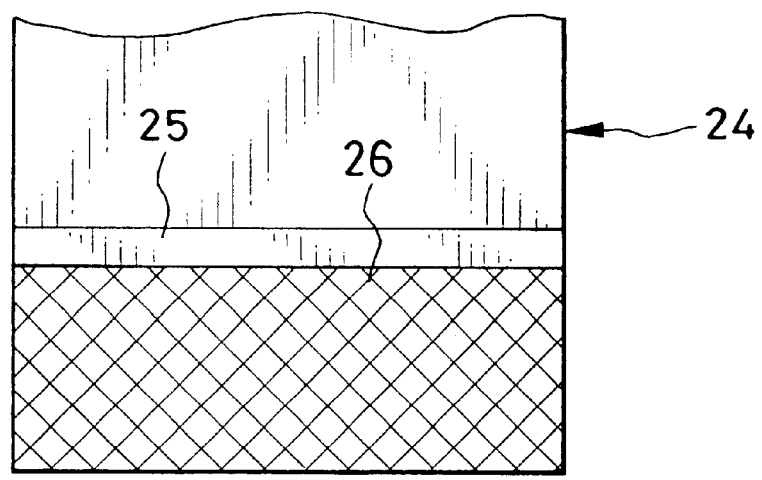
FIG. 9 is a plan illustrating an additional preferred flexible printed wiring board having a colored portion as an indicia.

Furthermore, a flexible printed wiring board 21 can include plural white line-shaped indicia 21a, 21b and 21c arranged serially in a manner of broken portions of one line. See FIG. 8. Also, a flexible printed wiring board 24 can have a white-colored portion 26 as indicia printed on a reinforcer plate 25 as second insulator layer in the whole region to be inserted in the connector 11. See FIG. 9.

Figure 10:
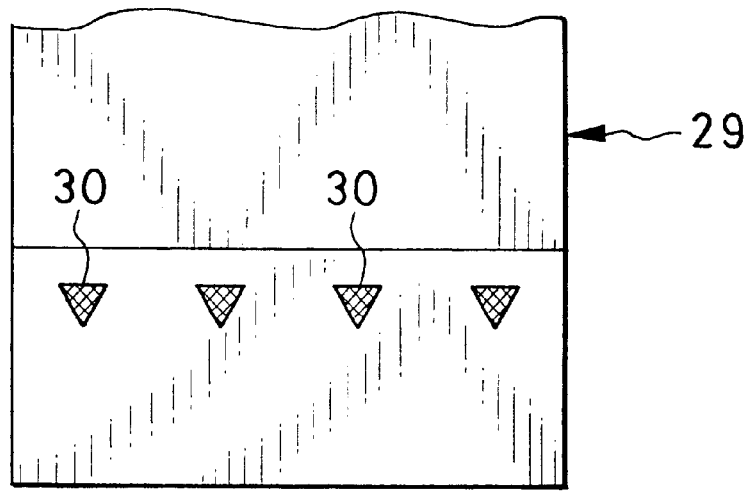
FIG. 10 is a plan illustrating still another preferred flexible printed wiring board having a line of plural triangular indicia.

In FIG. 10, another preferred flexible printed wiring board 29 is depicted, and has plural white indicia 30 which have a triangular shape and are arranged at a regular pitch. Note that the plural white indicia 30 may have any shape such as a quadrangular shape, other polygonal shapes, a circular shape, and other looped shapes. Also, plural indicia in two or more shapes may be combined and arranged in the width direction of the flexible printed wiring board 29.

In the above embodiments, the white indicia 9, 17, 18, 21a–21c, 26, 30 is disposed on the reinforcer plate 6, 25. But the flexible printed wiring board 2, 16, 21, 24, 29 may not have the reinforcer plate 6, 25. The indicia may be disposed directly on the base film 3 or the cover coating 5. In the above embodiments, the indicia are white. However it is possible to use colors other than white and distinct from the colors of the reinforcer plate 6, 25 or the insulator layers of the flexible printed wiring board. In the above embodiments, the connector 11 has the lock plate 14. However the flexible printed wiring board of the present invention may be used with the connector 11 of types not having the lock plate 14.

To be precise, the connector inner wall of the connector is provided with the plural contact points 13. A retaining mechanism of the connector retains the terminal section 8, 19 of the flexible printed wiring board. Such a retaining mechanism can be not only the lock plate 14 but also a bracket, screws, springs or the like.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A flexible printed wiring board connectable with a connector, comprising:

at least first and second flexible insulator layers;

a patterned line array of plural lines, extending in a line longitudinal direction, and disposed between said first and second insulator layers;

a terminal section, defined by extending said first insulator layer and said patterned line array from said second insulator layer in said line longitudinal direction, for partially uncovering said patterned line array for connection with said connector;

a reinforcer plate, secured to a surface of said first insulator opposite to said patterned line array, for reinforcing said terminal section; and at least one indicia, disposed on said reinforcing plate, and adapted to indicate an insertion amount of said terminal section in said connector.

2. A flexible printed wiring board as defined in claim 1, wherein said connector includes:

a connector inner wall, which has a wall edge, and on which said terminal section is set crosswise to said wall edge;

plural contact points, arranged on said connector inner wall along said wall edge, for contacting said terminal section;

when said terminal section is set on said connecter inner wall, said at least one indicia is substantially parallel to said wall edge.

3. A flexible printed wiring board as defined in claim 1, wherein said at least one indicia has a different color from a color of said first or second insulator layer.

4. A flexible printed wiring board as defined in claim 3, wherein said different color is a light color.

5. A flexible printed wiring board as defined in claim 1, wherein said at least one indicia is line-shaped and crosswise to said line longitudinal direction.

6. A flexible printed wiring board as defined in claim 1, wherein said at least one indicia is two line indicia extending along each other and crosswise to said line longitudinal direction, a space between said two indicia being adapted to indicate said insertion amount.

7. A flexible printed wiring board as defined in claim 1, wherein said at least one indicia is plural indicia arranged crosswise to said line longitudinal direction.

8. A flexible printed wiring board as defined in claim 1, wherein said at least one indicia is a colored portion having a region associated with said terminal section in said reinforcer plate, said colored portion being entirely contained in said connector while said terminal section is connected to said connector.

9. The flexible printed wiring board of claim 1, wherein said at least one indicia is a printed indicia.

10. The flexible printed wiring board of claim 9, wherein said printed indicia extends across said first insulation layer in a direction perpendicular to said line longitudinal direction.

* * * * *